United States Patent

[11] 3,602,540

[72] Inventor Boyd P. Page
Lakewood, Calif.
[21] Appl. No. 768,792
[22] Filed Oct. 18, 1968
[45] Patented Aug. 31, 1971
[73] Assignee TRW Inc.
Redondo Beach, Calif.

[54] PRINTED WIRING BOARD FUSING TOOL
5 Claims, 5 Drawing Figs.

[52] U.S. Cl. 294/16, 81/302, 294/97, 294/106
[51] Int. Cl. B65g 7/12
[50] Field of Search 81/302, 418, 414, 425; 294/16, 28, 97, 99, 103

[56] References Cited
UNITED STATES PATENTS

| | | | |
|---|---|---|---|
| 544,268 | /1895 | Unsinger et al. | 81/302 |
| 1,154,442 | /1915 | Sevison | 81/302 X |
| 1,441,452 | /1923 | Ringel | 294/28 |
| 1,546,989 | 7/1925 | Morris | 81/418 X |
| 3,181,906 | 5/1965 | De Rose et al. | 294/103 X |
| 3,193,316 | 7/1965 | Custer | 294/99 X |
| 3,282,137 | 11/1966 | Lovelace | 81/302 |

*Primary Examiner*—Andrew R. Juhasz
*Assistant Examiner*—Donald D. Evenson
*Attorneys*—Daniel T. Anderson, Gerald Singer and Alfons Valukonis

ABSTRACT: There is described a circuit board processing method and a tool for holding thin circuit boards in tension to permit dipping the board in a fusing bath of hot oil in order to fuse solder to the board. Holding the board in tension in a supported manner permits one to clear the feed holes in the board by impacting it sharply against a hard surface.

PATENTED AUG 31 1971

3,602,540

Boyd P. Page
INVENTOR

BY Donald C Kearney
ATTORNEY

PRINTED WIRING BOARD FUSING TOOL

BACKGROUND OF THE INVENTION

1. Field of the Invention

The invention pertains to a method of fusing printed circuit boards which have been plated with a solder compound and to a tool for holding this circuit board while the method is being carried out.

2. Description of the Prior Art

The problem solved by the invention is a relatively new one and applicant is not aware of any truly pertinent prior art. Where fusing has been carried out in the past by dipping the board in a hot fluid bath, the board was held typically by wholly conventional tools such as a pair of pliers. With the increasingly thin boards now being used, this fusing operation becomes more and more difficult since the hot fluid tends to soften the board. When the board becomes soft and pliable at these temperatures, the feedthrough holes become plugged with molten solder and a subsequent operation is required to remove the metal from the holes. This operation is a tedious, time-consuming one, and the boards are sometimes damaged in the process.

SUMMARY OF THE INVENTION

It is current practice in the electronics industry to electrodeposit a solder compound which is often a tin-lead compound onto a copper clad circuit board on those areas where it is desired to leave conductive paths. Thereafter the rest of the copper is etched away in a manner well known in the art. This etching away leaves small slivers of solder and possibly an imperfect bond between the solder and the copper. It is, therefore, desirable to fuse the solder so that it will melt and flow into a more complete bond with the copper when a reduced temperature again solidifies the solder. This fusing step also eliminates the slivers and all rough edges. Where relatively thick boards are used the excess material along the edge of the board can be grasped by any conventional fixtures such as a pair of pliers in order to dip it in a fusing bath. However, as both become increasingly thin this procedure is subject to the disadvantages noted above.

In accordance with the present invention, there is provided in the excess along the edges of the board a plurality of holes through which the attaching pins or the arms of a specially designed tool can be inserted in order to support the board in tension. The two arms of the tool are pivotally connected and provided with a split handle in such a fashion that when the handle is squeezed to a closed position, the arms of the tool open for a limited arc of travel in order to hold the board in tension. The board may then be dipped in the fusing bath and removed while still held in the tool. When the tool and board are then struck against a flat surface the impact will clear the feedthrough holes of excess solder without damaging or deforming the board.

DESCRIPTION OF THE PREFERRED EMBODIMENT

For the reasons noted above it is desirable in a printed circuit board manufacture to fuse circuit boards that have been plated with a tin-lead solder. The fusing operation, however, is a difficult one particularly when it is required on circuit boards which are less than 0.07-inch thick and when the feedthrough-hole sizes are less than 0.06-inch diameter. The difficulty lies in the fact that the fusing is done by immersing the board in a hot bath of oil which is normally approximately 450° F. to cause the plated tin-lead to go into the fluid state. The board itself becomes very soft and pliable at this temperature and the hole gets plugged with molten tin-lead.

In accordance with the present invention the board is supported in tension by a mechanical holding tool. It is then immersed in hot oil or any other fluid suitable for fusing tin-lead. After a few seconds the board can be removed and while still in the holding tool the holes can be cleared by striking the tool with the board mounted therein against a flat surface. The tool disclosed herein can be loaded and unloaded rapidly to facilitate production of circuit boards.

Figure 3:
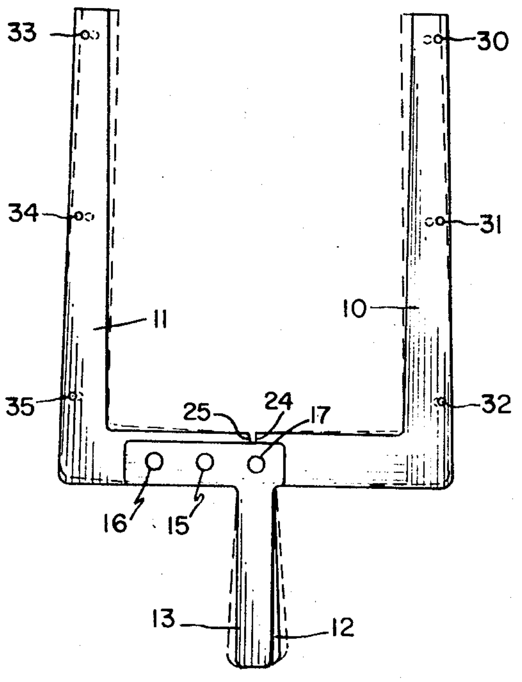
FIG. 3 is an assembled front view of the tool wherein the open position of the arms is shown in dashed line and the closed or tension position is shown in solid line.
Figure 1:
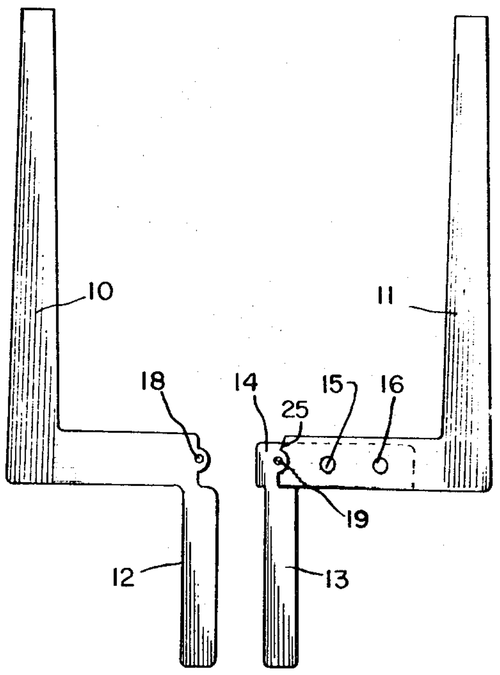
FIG. 1 is an exploded rear view showing the two arms of the tool.
Figures 2, 4:
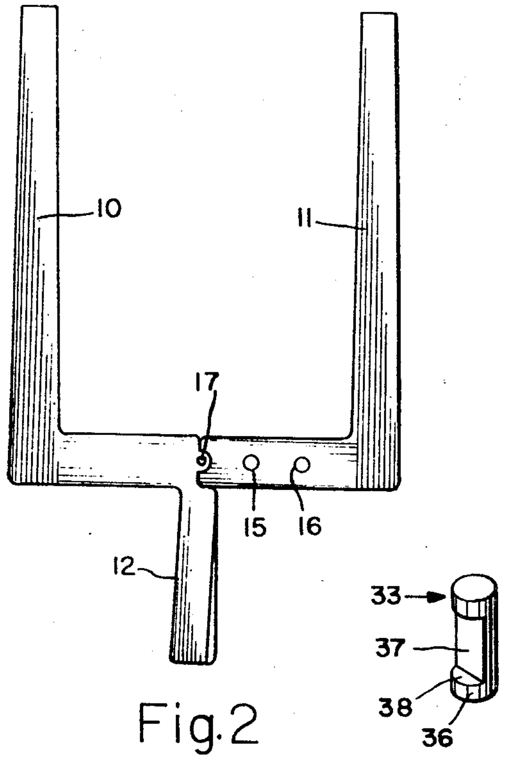
FIG. 2 is an assembled rear view showing the two arms of the tool.
FIG. 4 is a detailed isometric view of one of the attaching pins on the arms.

A preferred embodiment of the tool is shown in the drawings. In FIG. 1 there is shown a first generally L-shaped arm 10 and a second generally L-shaped arm 11. The arm 10 is provided with a downwardly extending handle member 12 which is integral with the arm 10 and lies entirely in the same plane as the arm. Attached to the arm 11 is a second handle member 13 which is itself illustrated as being L-shaped and which has the upper surface 14 attached to the under surface of the lower portion of the arm 11 by rivets or screws 15 and 16. If desired, the arm 11 and its handle 13 could be cast, machined, or fabricated as a single integral unit. It should be noted, however, that whatever the method of manufacture the two arms 10 and 11 and the handle member 12 lie in the same horizontal plane whereas arm 13 is offset from arm 11 so that when the arms 10 and 11 are assembled as shown in FIGS. 2 and 3 the handle 12 will lie entirely above the handle member 13 as considered from the assembled back view of FIG. 2. Alternatively, of course, if considered from the point of view of the assembled front view of FIG. 3, the handle 13 will lie entirely above the handle member 12.

The two arms are connected by placing a rivet or other pivot member 17 through a hole 18 in arm 10 and a hole 19 in arm 11. The two holes, of course, are first brought into registration to form an assembly as shown in FIGS. 2 and 3.

Figure 5:
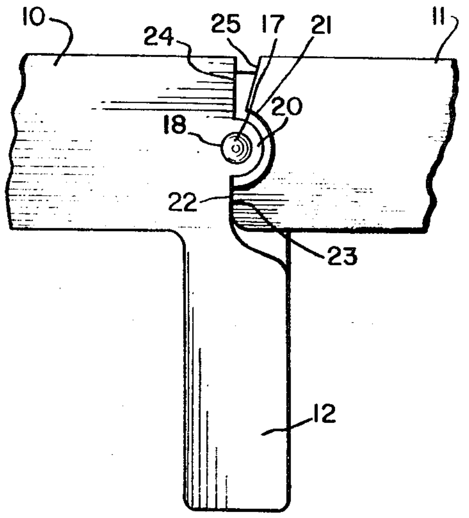
FIG. 5 is an enlarged view of the pivotal joint showing the manner in which the arm configurations limit the possible travel.

In FIG. 5 there is shown an enlarged view of the pivoting joint as shown in FIG. 2. In FIG. 5, it will be noted that the hole 18 on arm member 10 which receives pivot member 17 is formed in a semicircular protrusion from the lower portion of arm member 10. The lower portion of arm member 11 is provided with a complimentary semicircular recess 21 to receive the semicircular protrusion 20 on arm 10. The hole 19 in the handle member 13 shown in FIG. 1 is positioned within and beneath the semicircular recess 21 so as to be coaligned with hole 18 when the members are assembled.

It will be noted that the pivot joint in FIG. 5 is shown with handles in the closed position which places the arms in the open or tension-applying position. The limit of the travel in this direction is established by the abutment of edge 22 lying below the semicircular protrusion 20 on handle member 10 with the edge 23 of handle member 11 which is positioned opposite to edge 22.

The stop or limit of travel in the opposite direction is provided by a similar relationship between edge member 24 on handle 10 and edge member 25 on handle 11. It will be noted that in the position shown in FIG. 5 edge members 24 and 25 are not in abutting relationship against each other but form an acute angle with its apex at the pivot point 17. This, of course, results from the fact that the edge members 22 and 24 on arm 10 are coaligned in a straight line whereas the edge members 23 and 25 on arm 11 are not coaligned. The edge member 25 is angled back from the pivot 17 in order to provide a limited area for pivotal motion of the arms and handles. The acute angle between edge members 24 and 25 thus defines the limit of pivotal rotation and hence the limit of travel of the arms.

Considering the solid line or tension-applying position of FIG. 3 it will be noted that arm 10 is provided with attaching pins 30, 31 and 32 whereas arm 11 is provided with attaching pins 33, 34 and 35. All of these pins are identical and the pin 33 is illustrated in FIG. 4. The pin has a base position 36 which may be threaded or welded into the arm 11. The pin is of the undercut type and in one typical example was 0.2-inch in diameter and 0.25-inch high. The undercut is formed by milling out a flat surface 37 in the midportion of the pin to form a retention slot having a lower shoulder 38 which supports the bottom surface of the board. As noted earlier, suitably sized holes for clearing the outer diameter of the pin are predrilled in the excess material along the edge of the circuit board. These holes are then slipped over the pins while the arms are in their closed or compressed position. As the split handle members are pressed together the forks or arms 10 and 11 open, the circuit board seats in the retention slots of each of the pins and is supported on the shoulders such as shoulder 38 and the flat surface 37 of the pin urges the edge of the board outwardly. Since the forks or arms open in opposite directions of travel this outward urging applies tension to the board and holds it very firmly in operative position for dipping. The operator, of course, continues to grasp the split handles and press them together while he is dipping the board and while he is thereafter striking the board against a surface to clear the holes.

While a specific preferred embodiment of the invention has been described by way of illustration only, it will be understood that the invention is capable of many other specific embodiments and modifications and is defined solely by the following claims.

I claim:

1. A tool for holding a printed circuit board in tension comprising:
a first arm member;
a second arm member;
a plurality of holding pins on each of said arm members for positioning through holes in the circuit board, each of said pins having at least one circuit-board-retaining slot with a lower shoulder for supporting the bottom surface of the circuit board;
means for pivotally connecting said first and second arm members to each other for rotation about a common pivot point; and
individual handle means integral with each of said arm members, respectively, for causing said arms to move away from each other to increase the distance between said pins on said respective arm members.

2. The tool of claim 1 wherein said means for pivotally connecting said first and second arm members includes stop means for limiting the pivotal travel of said arms.

3. The tool as set forth in claim 2 wherein said stop means comprises:
a first pair of edges on said first and second arm members, respectively, adapted for abutment to limit pivotal travel of said arms in one direction; and
a second pair of edges on said first and second arm members, respectively, adapted for abutment for limiting the pivotal travel of said arms in the opposite direction.

4. The tool as set forth in claim 3 wherein said second pair of edges defines an acute angle with its apex at said pivot point when said first pair of edges abut.

5. The tool as set forth in claim 1 wherein said handle means comprises a split handle having a first member integral with said first arm member and a second member integral with said second arm member, said first and second handle members lying one above the other so that when they are pressed together the arms open to move said holding pins further apart.